(12) United States Patent
Kawano et al.

(10) Patent No.: US 7,219,320 B2
(45) Date of Patent: May 15, 2007

(54) SEMICONDUCTOR INTEGRATED CIRCUIT TIMING ANALYSIS APPARATUS TIMING ANALYSIS METHOD AND TIMING ANALYSIS PROGRAM

(75) Inventors: Tetsuo Kawano, Kawasaki (JP); Satoru Yoshikawa, Kawasaki (JP); Toshikatsu Hosono, Kasugai (JP); Shigenori Ichinose, Kawasaki (JP); Takashi Yoneda, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 299 days.

(21) Appl. No.: 10/807,286

(22) Filed: Mar. 24, 2004

(65) Prior Publication Data

US 2005/0081171 A1 Apr. 14, 2005

(30) Foreign Application Priority Data

Oct. 14, 2003 (JP) .............................. 2003-353950

(51) Int. Cl.
*G06F 17/50* (2006.01)
(52) U.S. Cl. ........................................... 716/6; 703/19
(58) Field of Classification Search .................... 716/4, 716/6, 10; 703/19; 327/141, 144
See application file for complete search history.

(56) References Cited

U.S. PATENT DOCUMENTS

| | | | |
|---|---|---|---|
| 5,365,463 A * | 11/1994 | Donath et al. ................. 703/19 |
| 5,579,510 A * | 11/1996 | Wang et al. ..................... 716/6 |
| 5,917,350 A * | 6/1999 | Graf, III ........................ 327/144 |
| 6,359,479 B1 * | 3/2002 | Oprescu ....................... 327/141 |
| 6,473,890 B1 * | 10/2002 | Yasui et al. ..................... 716/10 |
| 2004/0254776 A1 * | 12/2004 | Andou ............................ 703/19 |

FOREIGN PATENT DOCUMENTS

| JP | 2001-306647 | * 2/2001 |
|---|---|---|
| JP | 03-005888 | * 11/2001 |

OTHER PUBLICATIONS

Hasegawa et al., "Timing Analysis System Heart for Large Scale Circuit (1) Procedure for Increasing Speed," 35th National Convention, Lecture Symposium (III), 1987, 5 pages.*
Patent Abstracts of Japan of JP 63098042 A dated Apr. 28, 1988.
Patent Abstracts of Japan of JP 2002222232 A dated Aug. 9, 2002.

* cited by examiner

*Primary Examiner*—Leigh M. Garbowski
(74) *Attorney, Agent, or Firm*—Staas & Halsey LLP

(57) ABSTRACT

OCV coefficients in a path being an analysis target according to the number of gate stages are calculated in a coefficient arithmetically operating unit by canceling off a variation in delay in each gate in accordance with the number of gate stages in the target path, and timing analysis of the target path is performed in a timing analysis unit by using the OCV coefficient with the number of gate stages being considered, whereby a variation degree in the entire path is reduced in accordance with the number of gate stages in the target path, thus making it possible to carry out accurate timing analysis in consideration of the variation in a chip of a semiconductor integrated circuit.

13 Claims, 9 Drawing Sheets

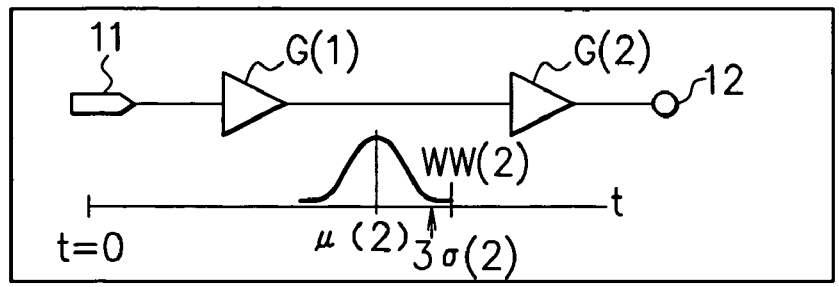
F I G. 1A
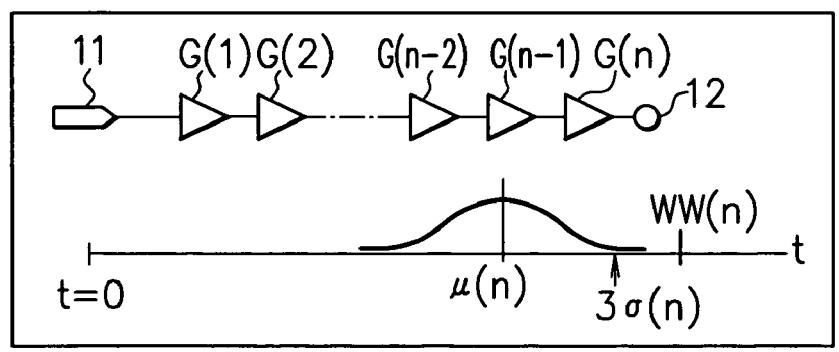
F I G. 1B
F I G. 2
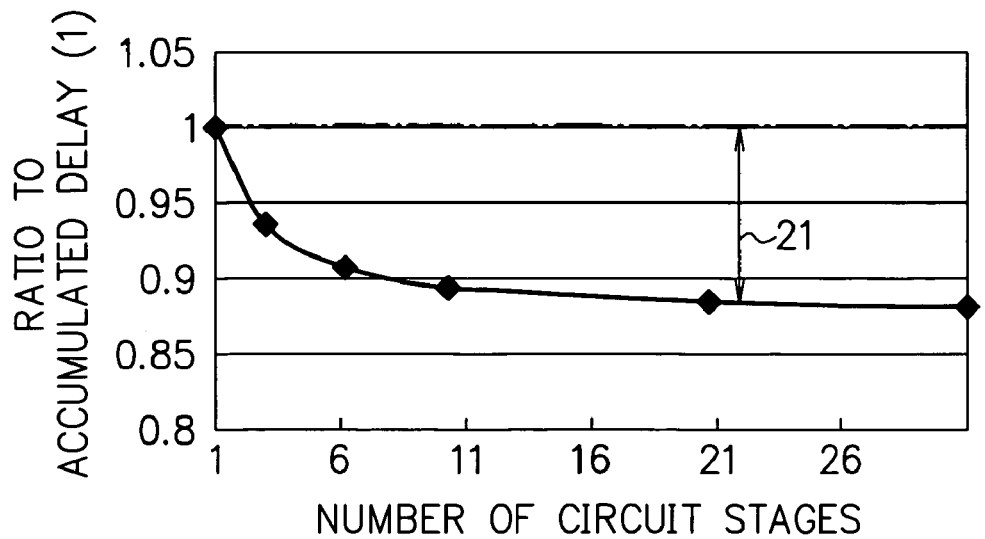

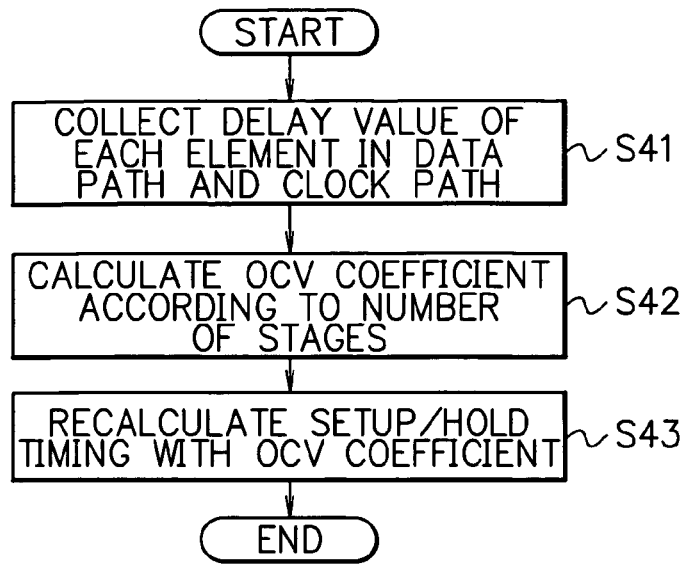
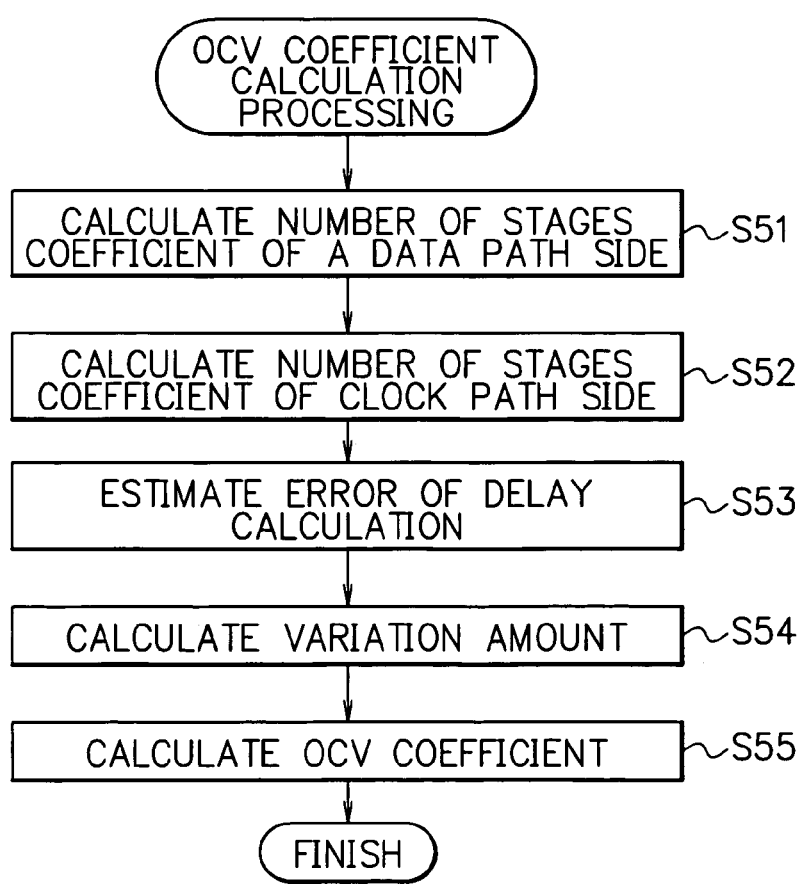

F I G. 6A
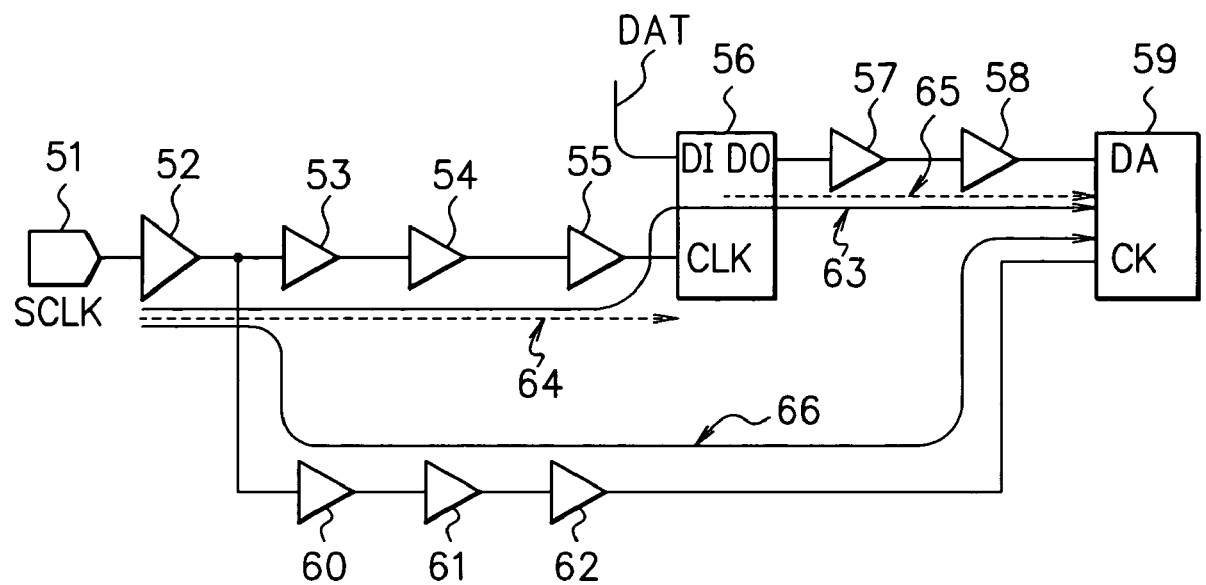
F I G. 6B
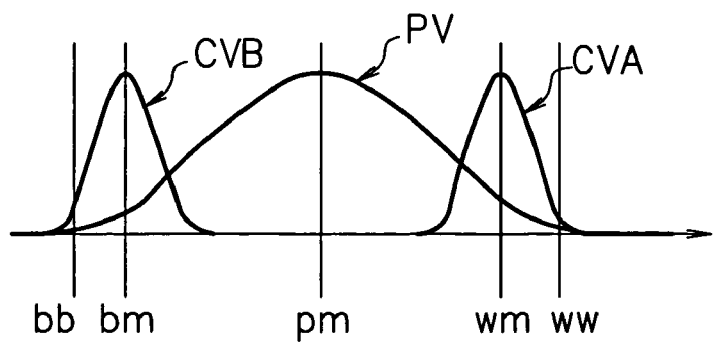

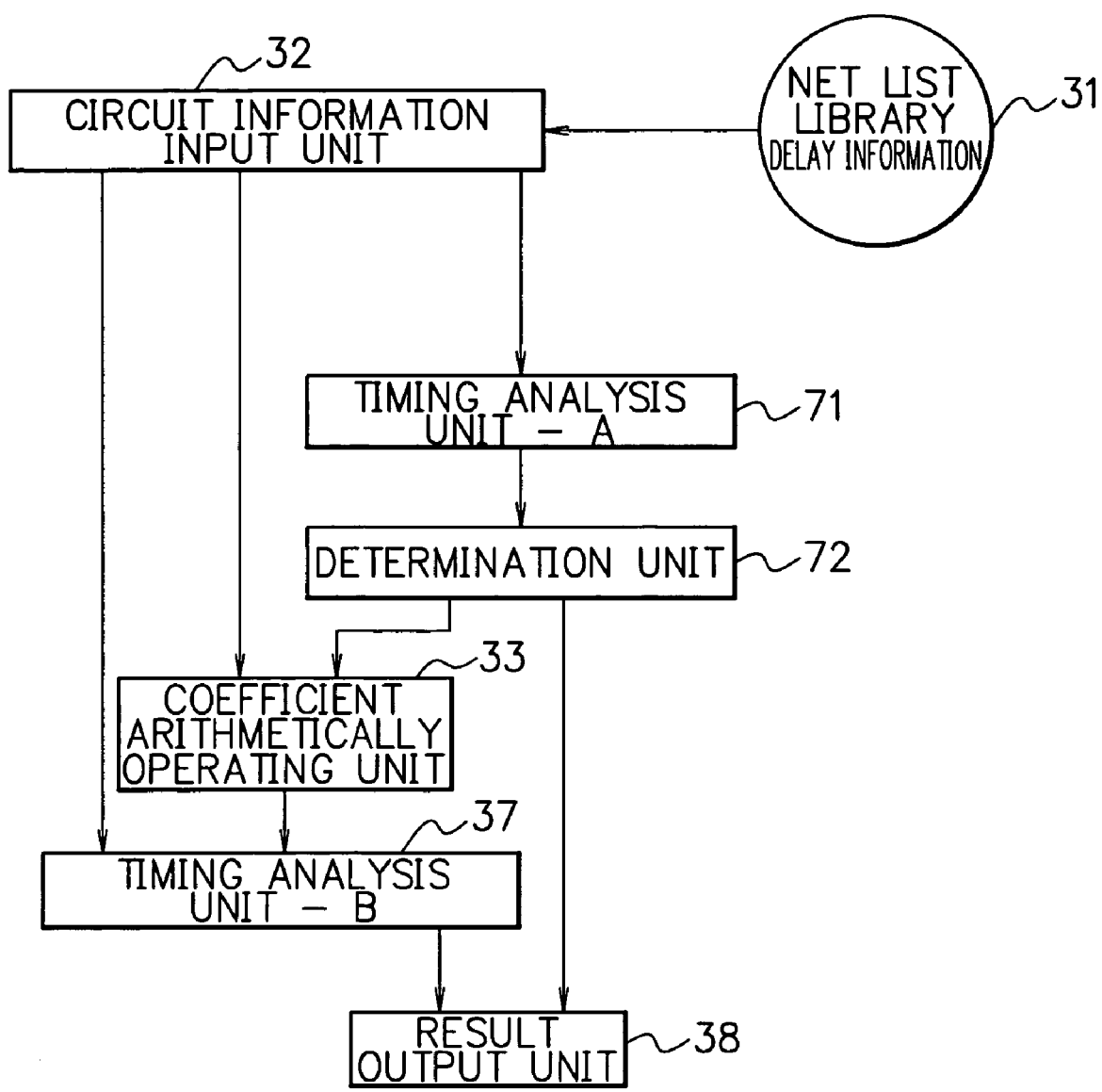

FIG. 9A

| NUMBER OF STAGES | 1 | 3 | 5 | 10 | 20 | 40 |
|---|---|---|---|---|---|---|
| $Kn\_max$ | 1 | 0.94 | 0.92 | 0.90 | 0.89 | 0.88 |
| | | | | | | |
| NUMBER OF STAGES | 1 | 3 | 5 | 10 | 20 | 40 |
| $Kn\_min$ | 1.00 | 1.08 | 1.11 | 1.13 | 1.15 | 1.16 |

FIG. 9B

| $Kn\_max$ | CK | | | | | |
|---|---|---|---|---|---|---|
| BETWEEN FFS | 1 | 3 | 5 | 10 | 20 | 40 |
| 1 | 0.98 | 0.95 | 0.93 | 0.91 | 0.89 | 0.88 |
| 3 | 0.93 | 0.92 | 0.91 | 0.90 | 0.89 | 0.88 |
| 5 | 0.91 | 0.90 | 0.90 | 0.89 | 0.89 | 0.88 |
| 10 | 0.89 | 0.89 | 0.89 | 0.88 | 0.88 | 0.87 |
| 20 | 0.87 | 0.87 | 0.87 | 0.87 | 0.87 | 0.87 |

FIG. 9C

| $Kn\_min$ | CK | | | | | |
|---|---|---|---|---|---|---|
| BETWEEN FFS | 1 | 3 | 5 | 10 | 20 | 40 |
| 1 | 1.03 | 1.07 | 1.09 | 1.12 | 1.14 | 1.16 |
| 3 | 1.09 | 1.10 | 1.11 | 1.13 | 1.14 | 1.16 |
| 5 | 1.12 | 1.12 | 1.13 | 1.14 | 1.15 | 1.16 |
| 10 | 1.14 | 1.14 | 1.15 | 1.15 | 1.15 | 1.16 |
| 20 | 1.16 | 1.16 | 1.16 | 1.16 | 1.17 | 1.17 |

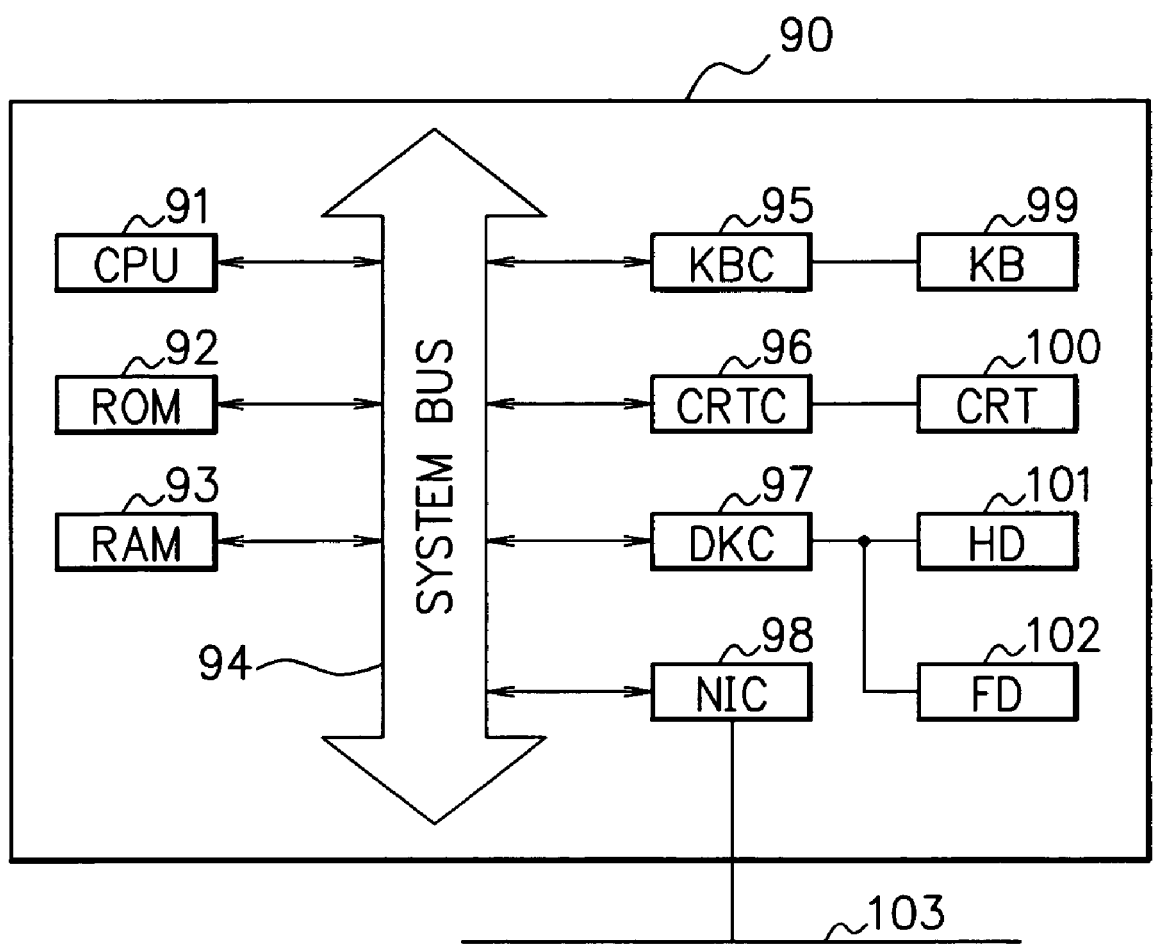

SEMICONDUCTOR INTEGRATED CIRCUIT TIMING ANALYSIS APPARATUS TIMING ANALYSIS METHOD AND TIMING ANALYSIS PROGRAM

CROSS-REFERENCE TO RELATED APPLICATIONS

This application is based upon and claims the benefit of priority from the prior Japanese Patent Application No. 2003-353950, filed on Oct. 14, 2003, the entire contents of which are incorporated herein by reference.

BACKGROUND OF THE INVENTION

1. Field of the Invention

The present invention relates to a timing analysis apparatus, a timing analysis method and a program product for a semiconductor integrated circuit, which is particularly preferable for use in static timing analysis in a semiconductor integrated circuit.

2. Description of the Related Art

As a method of conducting timing verification of a semiconductor integrated circuit such as an LSI, especially a digital circuit, static timing analysis (STA) is conventionally used. In the static timing analysis, timing verification of a circuit is conducted based on delays assigned respectively to elements and the like in the circuit, unlike circuit simulation and logical simulation which are conducted to correspond to an actual operation logically.

Namely, in the static timing analysis, creation of a test pattern or the like is not needed, and timing verification is conducted by accumulating a delay of each element and the like in a path (signal flow path). The static timing analysis requires short time for verification, and is capable of comprehensively analyzing an entire chip at one time, and therefore static timing analysis apparatuses are used as one of the verification apparatuses for designs of most of the semiconductor integrated circuits recently.

Here, there are normally variations in the characteristics of the elements in the semiconductor integrated circuit, and it is necessary to carry out static timing analysis in consideration of the variations. At present, static timing analysis is generally carried out by expressing the variation of each element by multiplying the delay of each element by an equal coefficient (for example, refer to Patent document 1 (Japanese Patent Laid-open No. 63-98042), and Patent document 2 (Japanese Patent Laid-open No. 2002-222232). The variation in the delay of each element is expressed in this manner, and it is verified whether the semiconductor integrated circuit is normally operable or not when the variation in the chip occurs.

For example, in the conventional static timing analysis, timing verification of a semiconductor integrated circuit under the worst condition is conducted by verifying whether the conditions expressed by the following expressions (19) and (20) are satisfied or not. Here, the worst condition is the condition under which the circuit operates at a low speed, and corresponds to the case in which process (P) is at a low speed, temperature (T) is high, and voltage (V) is low.

$$\text{Cycle\_Time} + \text{Clock\_path\_time} \times ocv\_\text{worst} - \text{Data\_time} - \text{Setup\_time} > 0 \quad (19)$$

$$\text{Data\_path\_time} \times ocv\_\text{worst} - \text{Clock\_path\_time} - \text{Hold\_time} > 0 \quad (20)$$

Similarly, timing verification of a semiconductor integrated circuit under the best condition is conducted by verifying whether the conditions shown by the following expressions (21) and (22) are satisfied, or not. The best condition is the condition under which the circuit operates at a high speed, and corresponds to the case in which process (P) is at a high speed, temperature (T) is low, and voltage (V) is high.

$$\text{Cycle\_Time} + \text{Clock\_path\_time} - \text{Data\_path\_time} \times ocv\_\text{best} - \text{Setup\_time} > 0 \quad (21)$$

$$\text{Data\_path\_time} - \text{Clock\_path\_time} \times ocv\_\text{best} - \text{Hold\_time} > 0 \quad (22)$$

The above-described expressions (19) and (21) are conditional expressions for verifying setup time, and the above-described expressions (20) and (22) are conditional expressions for verifying hold time.

In the above-described expressions (19) to (22), Cycle_Time is a cycle of a clock signal, Clock_path_time is a clock path delay, Data_path_time is a data path delay, Setup_time is a value of standard of setup time, Hold_time is a value of standard of hold time, ocv_worst is a variation coefficient under the worst condition, and ocv_best is a variation coefficient under the best condition. The coefficients ocv_worst and ocv_best are constant values which are previously specified to express variations in delay.

SUMMARY OF THE INVENTION

A timing analysis apparatus of the present invention comprises a coefficient arithmetically operating unit for calculating a variation coefficient of delay time in a path to be analyzed in a semiconductor integrated circuit, and a first timing analysis unit for performing timing analysis in the path to be analyzed. The above-described coefficient arithmetically operating unit calculates the variation coefficient of the delay time in the path to be analyzed with a variation in the delay time in each gate being cancelled out in accordance with a number of gate stages in the path to be analyzed, and the first timing analysis unit performs timing analysis based on the variation coefficient and the inputted circuit information.

According to the present invention constituted as described above, the variation of the delay time in each gate inside the chip is cancelled out in accordance with the number of gate stages of the path to be analyzed, and the variation degree in the entire path is reduced.

The timing analysis apparatus of the present invention may further comprise a second timing analysis unit for performing timing analysis in a path to be analyzed, and a determination unit for determining whether previously specified timing conditions are satisfied or not based on an analysis result. The second timing analysis unit performs timing analysis in the path to be analyzed by accumulating a variation in the delay time of each gate based on the circuit information, and as a result, only when it is determined that the above-described timing conditions are not satisfied, the second timing analysis unit calculates the variation coefficient of the delay time in the coefficient arithmetically operating unit.

When constituted as above, timing analysis of the path to be analyzed is performed as in the prior art, and only when the timing conditions are violated, the variation coefficient of the delay time in the entire path with the variation in the delay time in each gate being cancelled out is calculated, and thereby timing analysis can be carried out.

BRIEF DESCRIPTION OF THE DRAWINGS

FIG. 1A and FIG. 1B are diagrams showing an example of a change in delay distribution according to a number of gate stages;

FIG. 2 is a graph showing correlation between a number of circuit stages and a delay in an entire path;

FIG. 4 is a flow chart showing an operation of the timing analysis apparatus in the first embodiment;

FIG. 5 is a flow chart showing an operation of OCV coefficient calculation processing;

FIG. 6A is a diagram for explaining concrete example of timing analysis in the first embodiment;

FIG. 6B is a diagram for explaining a variation in an entire process and a variation in a chip;

FIG. 7 is a block diagram showing a constitution example of a timing analysis apparatus according to a second embodiment;

FIG. 9A, FIG. 9B and FIG. 9C are diagrams showing examples of tables of a coefficient of each number of stages;

FIG. 10 is a block diagram showing a constitution example of a computer capable of realizing the timing analysis apparatus.

DETAILED DESCRIPTION OF THE PREFERRED EMBODIMENTS

However, in the conventional method of expressing a variation in delay of each element by multiplying the delay of the element by an equal coefficient as described above, there is the problem that an excessive margin is taken following an increase in the number of gate stages in a path. This is because the variation in each element in an actual chip follows Gaussian distribution (normal distribution), and the degree of variation in delay as the entire path becomes low as the number of stages increases.

The aforementioned problem in the conventional static timing analysis will be explained in concrete with reference to FIG. 11.

Figure 11:
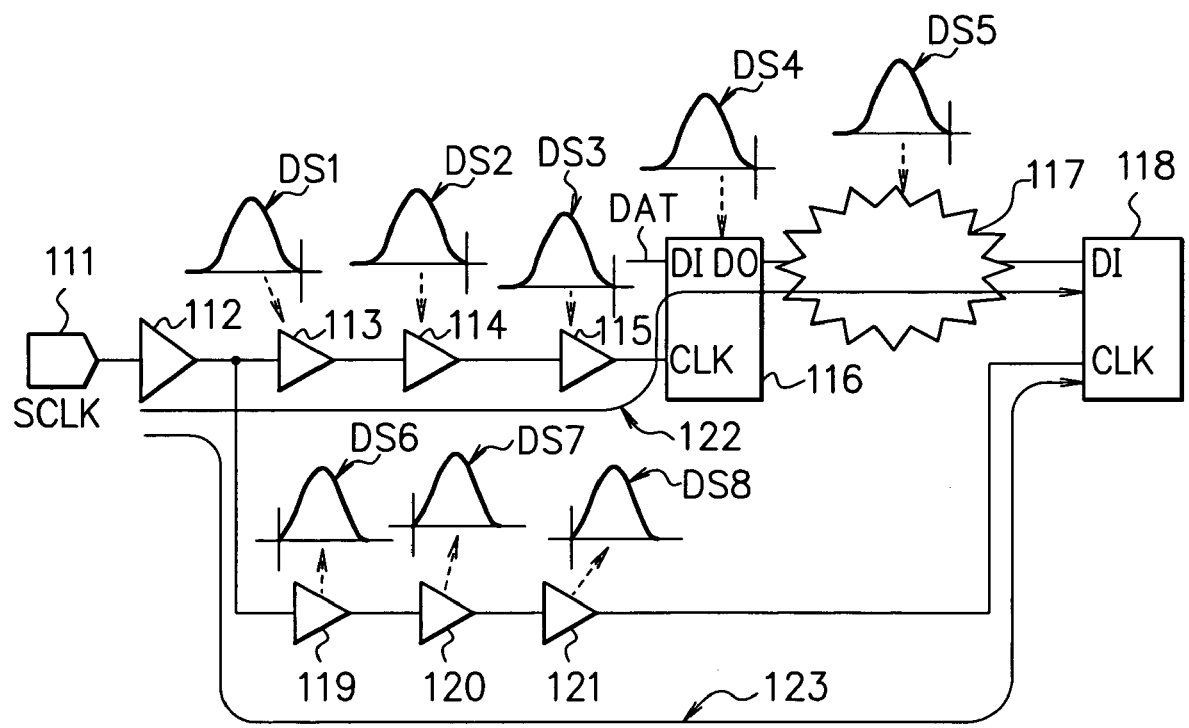
FIG. 11 is a diagram for explaining a problem of conventional static timing analysis.

FIG. 11 is a schematic diagram for explaining a verification method of setup time in the conventional static timing analysis. In FIG. 11, reference numeral 111 denotes a source (source of supply) of a clock signal SCLK. The clock signal SCLK outputted from the source 111 is inputted into a clock input terminal <CLK> of a flip flop (FF) 116 via buffers 112 to 115, and also inputted into a clock input terminal <CLK> of FF 118.

A data signal DAT is inputted into a data input terminal <DI> of the FF 116. The data signal outputted from a data output terminal <DO> of the FF 116 in synchronism with the clock signal SCLK is inputted into a data input terminal <DI> of the FF 118 via a combinational circuit 117.

In FIG. 11, DS1 to DS8 show distributions of variations of respective elements (for convenience of explanation, the combinational circuit is also assumed to be an element) 113 to 117, and 119 to 121.

On verification concerning setup time of the FF 118 in the conventional static timing analysis, the verification is conducted on the assumption that all the elements 112 to 117 on a data path 122 vary to a late side and all the elements 119 to 121 on a clock path 123 vary to an early side, as shown in FIG. 11.

However, the state in which all the elements vary to the late side or the early side as above is a substantially impossible state probabilistically, and in the conventional static timing analysis, timing verification is performed under the very strict conditions in which an excessive margin is insured. Accordingly, with the aforementioned conventional method, accurate timing analysis in a semiconductor integrated circuit cannot be carried out, and there occurs the problem of making it very difficult to design a semiconductor integrated circuit capable of high speed operation due to an excessive margin, for example.

The present invention is made in view of the above problem, and has its object to make it possible to carry out accurate timing analysis in consideration of variations in delay inside a chip according to the number of gate stages in a path.

An embodiment of the present invention will be explained based on the drawings hereinafter.

The explanation will be made hereinafter with a variation in delay time (delay), which is considered when timing analysis in a path to be analyzed (target path) is executed, being made 3 $\sigma$ ($\sigma$ is a standard deviation of delay distribution) for convenience of explanation, but the variation in delay which is considered when timing analysis is executed is optional, and it may be, for example, 4$\sigma$, 2$\sigma$, or $\sigma$.

First, a change in a delay value and its distribution according to the number of gate stages (also called "number of circuit stages") of a circuit will be explained.

FIGS. 1A and 1B are diagrams for explaining a change in delay distribution according to the number of circuit stages.

In FIGS. 1A and 1B, reference numeral 11 denotes a starting point of a path (transmission path of a signal) which is a target of the timing analysis, and reference numeral 12 denotes an end of the path. For example, the starting point 11 corresponds to a source (a supply source, an input terminal or the like) of a signal, and the end 12 corresponds to an input terminal of a flip flop. Reference symbol G(i) (i is a natural number) denotes a gate (element) such as a buffer which is connected in series between the starting point 11 and the end 12. A central value (average value) of a delay of each gate G(i) is μi, and the variation (standard deviation) in the delay is σi.

Reference symbol μ(j) (j is a natural number) denotes a central value in a distribution of arrival time (delay) until a signal inputted from the starting point 11 arrives at the end 12 via the gates G(1) to G(j) in the case in which the number of gate stages is j. Reference symbol ww(j) denotes a delay in the worst condition (in the case in which all the gates G(i) are delayed by 3σ) which is obtained by the conventional method, and 3σ(j) is a delay when a 3σ delay occurs in view of the entire path, which are obtained according to the following expressions (1) and (2), respectively.

$$ww(j) = \Sigma(\mu i + 3\sigma i) \quad (1)$$
$$= \Sigma \mu i + 3\Sigma \sigma i$$

$$3\sigma(j) = \Sigma \mu i + 3\sqrt{\Sigma \sigma i^2} \quad (2)$$

Namely, ww(j) is the delay obtained by simply accumulating 3σ which is the delay in each gate G(i), while 3σ(j) is the delay in consideration of the probability according to the number of gate stages.

When the number of gate stages is two as shown in FIG. 1A, a difference (difference in variation in the arrival time) between ww(2) obtained as in the prior art and 3σ(2) obtained in consideration of the number of gates in view of the entire path is not very large. In contrast to this, when the number of gate stages is large as shown in FIG. 1B, a difference between ww(n) and 3σ(n) (n is a natural number, and the number of gate stages) becomes large.

FIG. 2 is a graph showing correlation between the number of circuit stages (number of gate stages) obtained by Monte Carlo analysis of the path delay and the delay in the entire path. In FIG. 2, the horizontal axis represents the number of circuit stages while the vertical axis represents the ratio to the accumulated delay. The ratio to the accumulated delay is the ratio of the delay value in consideration of the number of circuit stages of the entire path to the delay value of simple accumulation of 3σ of the variation of delay distribution in each gate on the path, and [3σ(j)]/[ww(j)].

As is obvious from FIG. 2, the ratio to the accumulated delay becomes smaller as the number of circuit stages becomes larger. The delay in the conventional method (accumulated delay) is "1" irrespective of the number of circuit stages, and therefore the difference 21 between the delay in consideration of the number of circuit stages shown by the solid line in FIG. 2 and "1", namely, the difference between ww(j) and 3σ(j) is a timing margin excessively insured in the conventional timing verification. Namely, the timing margin excessively insured, which is shown by the difference between ww(j) and 3σ(j) becomes larger as the number of circuit stages is larger.

Thus, in an embodiment of the present invention which will be explained hereinafter, timing analysis is performed with use of the delay distribution and its variation in the entire path in consideration of the probability according to the number of gate stages (3σ(j) corresponding to the number of gate stages in the aforementioned explanation).

First Embodiment

Figure 3:
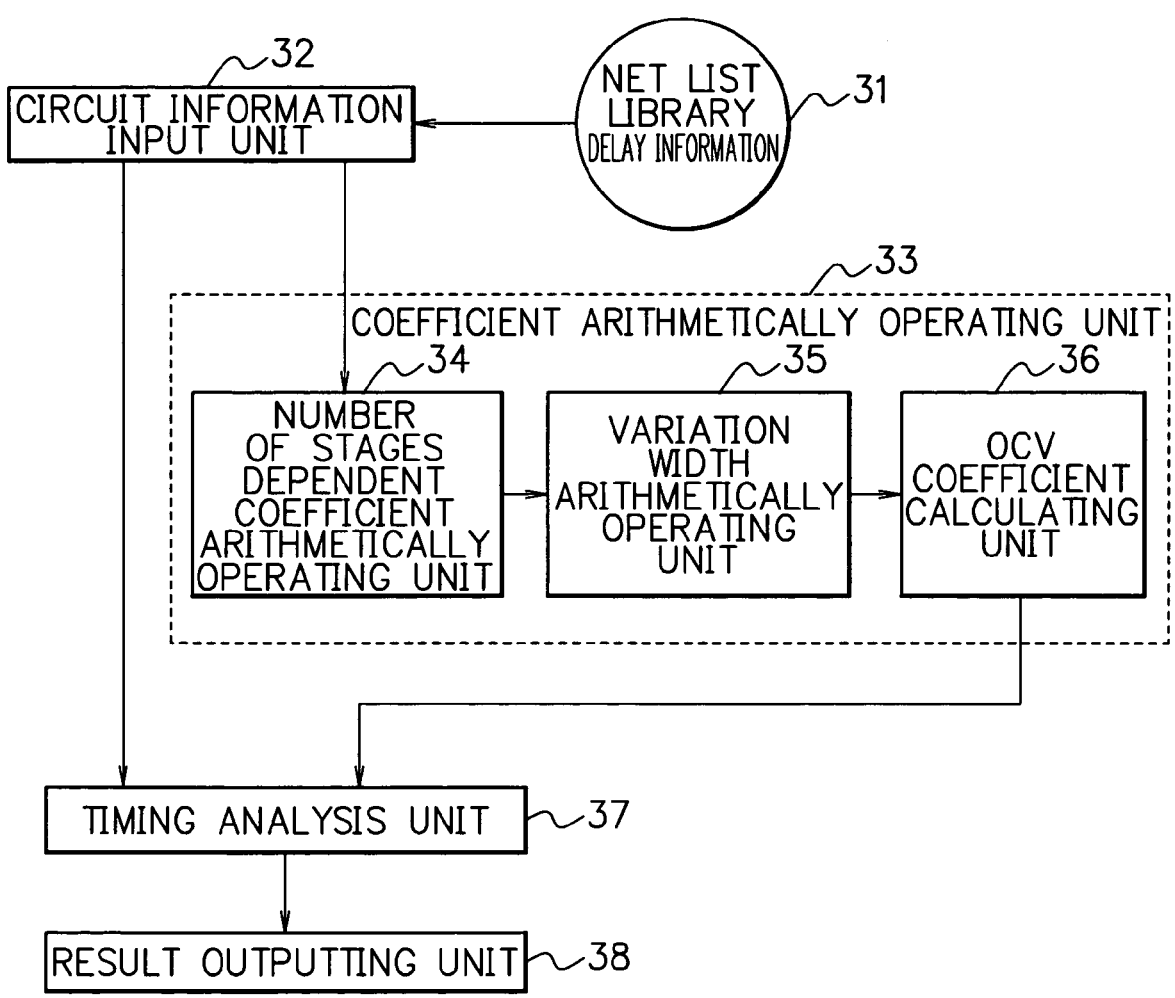
FIG. 3 is a block diagram showing a constitution example of a timing analysis apparatus in a first embodiment.

FIG. 3 is a block diagram showing a constitution example of a timing analysis apparatus according to a first embodiment of the present invention.

In FIG. 3, reference numeral 32 denotes a circuit information input unit, in which circuit information 31 of a semiconductor integrated circuit which is the analysis target is inputted, and which outputs the circuit information to a coefficient arithmetically operating unit 33 and a timing analysis unit 37. Here, the circuit information 31 include, for example, a net list showing connection relationship among circuit elements and the like, library of the circuit elements and the like, delay information and the like.

The coefficient arithmetically operating unit 33 cancels out a variation in delay in each gate in accordance with the number of gate stages in a path being an analysis target (target path) based on the inputted circuit information, and calculates a variation coefficient (OCV coefficient) in delay time in the target path according to the number of gate stages. The coefficient arithmetically operating unit 33 has a coefficient of the number of stages arithmetically operating section 34, a variation width arithmetically operating section 35 and an OCV coefficient calculating section 36.

The coefficient of the number of stages arithmetically operating section 34 calculates the coefficient of the number of stages showing a variation amount of delay according to the number of gate stages in the target path by using the circuit information. The coefficient of the number of stages is the ratio of the delay in the entire path in consideration of the probability according to the number of gate stages and the delay obtained by simply accumulating the variation 3σ in each element existing on the path as in the prior art, and is calculated for each target path. The variation width arithmetically operating section 35 calculates variation width (variation amount) in a chip in the coefficient of the number of stages calculated in the coefficient of the number of stages arithmetically operating section 34, namely, the variation width in the delay in the entire target path. The OCV coefficient calculating section 36 calculates the OCV coefficient in consideration of the number of gate stages with use of the circuit information, the coefficient of the number of stages calculated in the coefficient of the number of stages arithmetically operation section 34, and the variation width calculated in the variation width calculating section 35, and outputs the calculated OCV coefficient to the timing analysis unit 37.

The timing analysis unit 37 performs timing analysis (verification concerning the timing conditions relating to the setup time and hold time) of the target path with use of the circuit information and the OCV coefficient in consideration of the number of gate stages, and supplies the analysis result to a result output unit 38. The result output unit 38 outputs the analysis result supplied by the timing analysis unit 37 by displaying it on a display device not shown, or outputting it as data, for example.

Next, an operation of the timing analysis apparatus in the first embodiment will be explained.

FIG. 4 is a flow chart showing an operation of the timing analysis apparatus shown in FIG. 3.

First, when the circuit information 31 such as the net list, library, and the delay information is inputted in the circuit information input unit 32 in step S41, the circuit information input unit 32 extracts a delay value (delay information) of each circuit element in the target path from the inputted circuit information 31. Extraction of the delay value of each circuit element is performed for each of the data path and the clock path of the target path.

When the OCV coefficient (in order to discriminate this from the OCV coefficient calculated in this embodiment, this conventional OCV coefficient will be called "old OCV coefficient", hereinafter), which is used in the conventional method and the equal value irrespective of the number of gate stages, is included in the extracted delay value, the old OCV coefficient is deleted. In concrete, when the information multiplied by the old OCV coefficient exists in the extracted delay value, this is divided by the old OCV coefficient, and the arithmetical operation result is made the delay value.

Next, in step S42, the coefficient arithmetically operating unit 33 executes the OCV coefficient calculation processing shown in FIG. 5 by using the circuit information including the delay value extracted in step S41, and calculates the OCV coefficient according to the number of gate stages of the target path.

FIG. 5 is a flow chart showing an operation of the OCV coefficient calculation processing.

When the OCV coefficient calculation processing is started, the coefficient of the number of stages arithmetically operating unit 34 calculates the coefficient of the number of stages at the data path side of the target path based on the circuit information including the extracted delay value of each circuit element (step S51). The coefficient of the number of stages is calculated for both of the case in which delay becomes large due to the variation in the delay distribution and the case in which the delay becomes small, namely for both of the worst condition and the best condition.

Similarly, the coefficient of the number of stages arithmetically operating unit 34 calculates the coefficient of the number of stages of the clock path side of the target path under the worst condition and the best condition by using the circuit information including the delay value of each circuit element (step S52).

In the aforementioned explanation, the coefficient of the number of stages calculating unit 34 calculates the coefficient of the number of stages of the clock path side, after calculating the coefficient of the number of stages at the data path side of the target path, but the computation sequence of the coefficient of the number of stages of the data path side and the coefficient of the number of stages of the clock path side is optional.

Next, the variation width arithmetically operating section 35 estimates a calculation error in the delay calculation, based on the circuit information and the calculated coefficient of the number of stages (step S53). As for the calculation error, the errors under the worst condition and the best condition are estimated concerning the setup time and the hold time.

Subsequently, the variation width arithmetically operating section 35 calculates variation width in the chip according to the number of gate stages under the worst condition and the best condition of the variation in the chip, based on the central value and the worst value under the worst condition and the central value and the best value under the best condition of the variation in the chip calculated based on the circuit information (step S54). For example, the variation width under the worst condition of the variation in the chip is calculated by calculating the difference between the worst value under the worst condition and its central value, and doubling the difference. The variation width in the chip is calculated for both the data path and the clock path of the target path.

Next, the OCV coefficient calculating section 36 calculates the OCV coefficient in consideration of the number of gate stages by using the coefficient of the number of stages, the calculation error of the delay calculation, and the variation width in the chip according to the number of gate stages, which are calculated in steps S51 to S54 as described above. Here, as for the OCV coefficient, the OCV coefficients under the worst condition and the best condition are calculated concerning the setup time and the hold time.

As described above, the OCV coefficients under the worst condition and the best condition concerning the setup time, and the OCV coefficients under the worst condition and the best condition concerning the hold time, namely, the OCV coefficients respectively corresponding to the four different conditions are calculated, whereby the OCV coefficient calculation processing is finished.

Returning to FIG. 4, in step S43, the timing analysis unit 37 performs timing calculation relating to the setup time and the hold time in the target path by using the circuit information relating to the target path and the OCV coefficient calculated as described above, and supplies the calculation result to the result output unit 38. Here, the calculation result outputted from the timing analysis unit 37 to the result output unit 38 may be the calculation result itself obtained from the circuit information relating to the target path and the OCV coefficient, or the difference from the value obtained by the conventional method.

After the processing in the aforementioned steps S41 to S43 are repeatedly executed for the other paths which are the analysis targets, the operation is finished. The result of the timing analysis supplied to the result output unit 38 as the calculation result is outputted from the result output unit 38 at any time in response to the demand from the outside.

The OCV coefficient calculation processing shown in the above-described FIG. 5 will be concretely explained with reference to FIG. 6A and FIG. 6B.

FIG. 6A is a diagram showing an example of a circuit for explaining the OCV coefficient calculation processing. In FIG. 6A, reference numeral 51 denotes a source (for example, a signal source or an input terminal) of a clock signal SCLK, and is a starting point of a path (target path) which is an analysis target. Reference numerals 52, 53, 54 and 55 are gates such as buffers, and are connected in series between the source 51 and a clock input terminal <CLK> of a flip flop (FF) 56. A signal line for supplying a data signal DAT is connected to a data input terminal <DI> of the FF 56.

Reference numerals 57 and 58 denote gates, which are connected in series between a data output terminal <DO> of the FF 56 and a data input terminal <DA> of FF 59. Namely, a data signal outputted from the FF 56 in synchronism with the clock signal SCLK is supplied to the FF 59 via the gates 57 and 58. The FF 59 (precisely, the data input terminal <DA> of the FF 59) corresponds to the end of the target path. Reference numerals 60, 61 and 62 denote gates, which are connected in series between the output terminal of the gate 52 and the clock input terminal <CK> of the FF 59. In the following explanation, the FF is also assumed to be a gate.

Reference numeral 66 denotes a synch clock path, and reference numeral 63 denotes a data path. The synch clock path 66 and the data path 63 respectively correspond to the clock path and data path in the aforementioned explanation. The data path 63 is constituted of a source clock path 64 (from the source 51 to the input of the FF 56), and an internal data path 65 (from the FF 56 to the input of the FF 59).

Here, the delay of each part under the best condition and the worst condition in the circuit shown in the above-described FIG. 6A will be shown as follows.

<Best Condition>
Delay of the gates 53, 54 and 55 . . . TgateCKD_bb
Delay of the gates 60, 61 and 62 . . . TgateCK_bb
Delay of the gates 56, 57 and 58 . . . TgateDA_bb
Delay by each wiring between the gates 52 and 53, between 53 and 54, between 54 and 55, and between 55 and 56 (clock input terminal <CLK>) . . . TlineCKD_bb
Delay by each wiring between the gates 52 and 60, between 60 and 61, between 61 and 62, and between 62 and 59 (clock input terminal <CK>) . . . TlineCK_bb
Delay by each wiring between the gates 56 (data output terminal <DO>) and 57, between 57, and 58, and between 58 and 59 (data input terminal <DA>) . . . TlineDA_bb <Worst Condition>
Delay of the gates 53, 54 and 55 . . . TgateCKD_ww
Delay of the gates 60, 61 and 62 . . . TgateCK_ww
Delay of the gates 56, 57 and 58 . . . TgateDA_ww
Delay by each wiring between the gates 52 and 53, between 53 and 54, between 54 and 55, and between 55 and 56 (clock input terminal <CLK>) . . . TlineCKD_ww
Delay by each wiring between the gates 52 and 60, between 60 and 61, between 61 and 62, and between 62 and 59 (clock input terminal <CK>) . . . TlineCK_ww
Delay by each wiring between the gates 56 (data output terminal <DO>) and 57, between 57 and 58, and between 58 and 59 (data input terminal <DA>) . . . TlineDA_ww The subscripts (bb, ww) in the writing of the above-described each delay will be explained with reference to FIG. 6B.

FIG. 6B is a diagram for explaining the variation in the entire process and the variation in the chip.

In FIG. 6B, PV represents the variation in the entire process, CVA represents the variation in the chip under the worst condition, and CVB represents the variation in the chip under the best condition. pm represents the central value in the distribution of the entire process. wm represents the central value and ww represents the worst value, under the worst condition in the variation in the chip. bm represents the central value and bb represents the best value, under the best condition in the variation in the chip (Note that the subscripts, wm, ww, bm and bb in the following explanation shall have the same meanings as in the aforementioned explanation.).

An OCV coefficient calculation processing operation in the circuit shown in the above-described FIG. 6A will be explained.

Hereinafter, the delay by the wiring will be explained as the fixed values of TlineDA_bb and TlineDA_ww without considering variations.

First, in step S51, the coefficient of the number of stages Kn_max_DA in the worst condition and the coefficient of the number of stages Kn_min_DA in the best condition on the data path 63 side are calculated by using the following expressions (3) and (4).

$$Kn\_max\_DA = \frac{\Sigma(TgateCKD\_ww \times ocv\_w + TlineCKD\_ww) + \Sigma(TgateDA\_ww \times ocv\_w + TlineDA\_ww)}{\Sigma(TgateCKD\_ww + TlineCKD\_ww) + \Sigma(TgateDA\_ww + TlineDA\_ww)} \quad (3)$$

$$TgateCKD\_wdv = TgateCKD\_ww - TgateCKD\_wm$$
$$TgateDA\_wdv\_TgateDA\_ww - TgateDA\_wm$$

In the above-described expression (3), ocv_w shows a variation in each gate, ocv_w=(TgateCKD_wm/TgateCKD_ww) or (TgateDA_wm/TgateDA_ww).

$$Kn\_min\_DA = \frac{\Sigma(TgateCKD\_bb \times ocv\_b + TlineCKD\_bb) + \Sigma(TgateDA\_bb \times ocv\_b + TlineDA\_bb)}{\Sigma(TgateCKD\_bb + TlineCKD\_bb) + \Sigma(TgateDA\_bb + TlineDA\_bb)} \quad (4)$$

$$TgateCKD\_bdv = TgateCKD\_bm - TgateCKD\_bb$$
$$TgateDA\_bdv = TgateDA\_bm - TgateDA\_bb$$

In the above-described expression (4), ocv_b shows a variation of each gate, ocv_b=(TgateCKD_bm/TgateCKD_bb) or (TgateDA_bm/TgateDA_bb).

Similarly, in step S52, the coefficient of the number of stages Kn_max_CK in the worst condition and the coefficient of the number of stages Kn_min_CK in the best condition on the synch clock path 66 side are calculated by using the following expressions (5) and (6).

$$Kn\_max\_CK = \frac{\Sigma(TgateCK\_ww \times ocv\_w + TlineCK\_ww) + \sqrt{\Sigma(TgateCK\_wdv^2)}}{\Sigma(TgateCK\_ww + TlineCK\_ww)} \quad (5)$$

$$TgateCK\_wdv = TgateCK\_ww - TgateCK\_wm$$

$$Kn\_min\_CK = \frac{\Sigma(TgateCK\_bb \times ocv\_b + TlineCK\_bb) - \sqrt{\Sigma(TgateCK\_bdv^2)}}{\Sigma(TgateCK\_bb + TlineCK\_bb)} \quad (6)$$

$$TgateCK\_bdv = TgateCK\_bm - TgateCK\_bb$$

In the above-described expressions (5) and (6), ocv_w and ocv_b show the variation of each gate, ocv_w=(TgateCK_wm/TgateCK_ww), and ocv_b=(TgateCK_bm/TgateCK_bb).

Next, in step S53, the calculation errors Sw_error, Sb_error, Hw_error and Hb_error in the delay calculation are calculated by using the following expressions (7) to (10). Here, Sw_error is the calculation error in the setup and the worst condition, and Sb_error is the calculation error in the setup and the best condition. Similarly, Hw_error is the calculation error in the hold and the worst condition, and Hb_error is the calculation error in the hold and the best condition. In the following expressions (7) to (10), K1 and K2 are predetermined constants, and in the expressions (7) to (10), it is assumed that optional K1 and K2 can be set.

$$Sw\_error = \{\Sigma(TgateCKD\_ww + TlineCKD\_ww) + \Sigma(TgateDA\_ww + TlineDA\_ww)\} \times Kn\_max\_DA \times K2 - \Sigma(TgateCK\_ww + TlineCK\_ww) \times Kn\_max\_CK \times K1 \quad (7)$$

$$Sb\_error = \{\Sigma(TgateCKD\_bb + TlineCKD\_bb) + \Sigma(TgateDA\_bb + TlineDA\_bb)\} \times Kn\_min\_DA \times K2 - \Sigma(TgateCK\_bb + TlineCK\_bb) \times Kn\_min\_CK \times K1 \quad (8)$$

$$Hw\_error = \Sigma(TgateCK\_ww + TlineCK\_ww) \times Kn\_max\_CK \times K1 - \{\Sigma(TgateCKD\_ww + TlineCKD\_ww) + \Sigma(TgateDA\_ww + TlineDA\_ww)\} \times Kn\_max\_DA \times K2 \quad (9)$$

$$Hb\_error = \Sigma(TgateCK\_bb + TlineCK\_bb) \times Kn\_min\_CK \times K1 - \{\Sigma(TgateCKD\_bb + TlineCKD\_bb) + \Sigma(TgateDA\_bb + TlineDA\_bb)\} \times Kn\_min\_DA \times K2 \quad (10)$$

Subsequently, in step S54, variation widths OcvD_worst, OcvD_best, OcvC_worst, and OcvC_best in the chip according to the number of gate stages are calculated respectively by using the following expressions (11) to (14). Here, OcvD_worst is the variation width under the worst condition in the data path 63, and OcvD_best is the variation width under the best condition in the data path 63. Similarly, OcvC_worst is the variation width under the worst condition in the synch clock path 66, and OcvC_best is the variation width under the best condition in the synch clock path 66. ocv_w and ocv_b in the following expressions (11) and (12) are the same as ocv_w and ocv_b in the expressions (3) and (4), and ocv_w and ocv_b in the expressions (13) and (14) are the same as ocv_w and ocv_b in the expressions (5) and (6).

$$OcvD\_worst = 2\sqrt{\Sigma\{(TgateCKD\_ww \times (1 - ocv\_w))^2\} + \Sigma\{(TgateDA\_ww \times (1 - ocv\_w))^2\}} \quad (11)$$

$$OcvD\_best = 2\sqrt{\Sigma\{(TgateCKD\_bb \times (ocv\_b - 1))^2\} + \Sigma\{(TgateDA\_bb \times (ocv\_b - 1))^2\}} \quad (12)$$

$$OcvD\_worst = 2\sqrt{\Sigma\{(TgateCK\_ww \times (1 - ocv\_w))^2\}} \quad (13)$$

$$OcvD\_best = 2\sqrt{\Sigma\{(TgateCK\_bb \times (ocv\_b - 1))^2\}} \quad (14)$$

Next, in step S55, the OCV coefficients Sw_OCV, Sb_OCV, Hw_OCV, and Hb_OCV with consideration of the number of gate stages are calculated respectively according to the following expressions (15) to (18) by using the coefficients of the number of stages, the calculation errors of the delay calculation, the variation width in the variation in the chip and the like which are calculated as described above. Here, Sw_OCV is the OCV coefficient in the setup and the worst condition, and Sb_OCV is the OCV coefficient in the setup and the best condition. Similarly, Hw_OCV is the OCV coefficient in the hold and the worst condition, and Hb_OCV is the OCV coefficient in the hold and the best condition.

$$Sw\_OCV = Kn\_max\_CK \times \quad (15)$$
$$\{1 + [(\Sigma(TgateCKD\_ww + TlineCKD\_ww) + \Sigma(TgateDA\_ww + TlineDA\_ww)) \times (1 - Kn\_max\_DA) - OcvC - error](\Sigma(TgateCK\_ww + TlineCK\_ww) \times Kn\_max\_CK)]\}$$

$$Sb\_OCV = Kn\_min\_DA \times \quad (16)$$
$$\{1 - [(\Sigma(TgateCK\_bb + TlineCK\_bb) \times (Kn\_min\_CK - 1) - OcvD - error] / [(\Sigma(TgateCKD\_bb + TlineCKD\_bb) + \Sigma(TgateDA\_bb + TlineDA\_bb)) \times Kn\_min\_DA)]\}$$

$$Hw\_OCV = Kn\_max\_DA \times \quad (17)$$
$$\{1 + [\Sigma(TgateCK\_ww + TlineCK\_ww) \times (1 - Kn\_max\_CK) - OcvD - error] / [\Sigma(TgateCKD\_ww + TlineCKD\_ww) + \Sigma(TgateDA\_ww + TlineDA\_ww)) \times Kn\_max\_DA]\}$$

$$Hb\_OCV = Kn\_min\_CK \times \quad (18)$$
$$\{1 + [(\Sigma(TgateCKD\_bb + TlineCKD\_bb) + \Sigma(TgateDA\_bb + TlineDA\_bb)) \times (1 - Kn\_min\_DA) + OcvC + error] / (\Sigma(TgateCK\_bb + TlineCK\_bb) \times Kn\_min\_CK)\}$$

Timing analysis is carried out by properly selecting the OCV coefficients Sw_OCV, Sb_OCV, Hw_OCV and Hb_OCV which are calculated as described above.

As explained thus far, according to the first embodiment, the variation in the delay in each gate is cancelled out in accordance with the number of gate stages in the target path, the OCV coefficients in the target path according to the number of gate stages are calculated by the coefficient arithmetically operating unit 33, and timing analysis of the target path is performed in the timing analysis unit 37 by using the calculated OCV coefficients with the number of gate stages being considered. As a result, the variation degree in the entire path is reduced in accordance with the number of gate stages of the target path, and the excessive margin included in the conventional method can be eliminated. Accordingly, accurate timing analysis in consideration of the variation in the chip of a semiconductor integrated circuit can be carried out, and timing analysis according to the proper timing margin becomes possible. For example, constraints in timing is eased as compared with the prior art, and design of the semiconductor integrated circuit demanded of a high-speed operation can be made more easily than the prior art.

Second Embodiment

Next, a second embodiment of the present invention will be explained.

A timing analysis apparatus according to the second embodiment, which will be explained hereinafter, initially performs timing analysis with the conventional method, and carries out the same timing analysis as in the above-described first embodiment for only the path which is determined as violating the timing conditions based on the analysis result.

FIG. 7 is a block diagram showing a constitution example of the timing analysis apparatus according to the second embodiment of the present invention. In FIG. 7, blocks having the same functions as the blocks shown in FIG. 3 are given the same reference numerals, and the redundant explanation will be omitted.

In FIG. 7, reference numeral 71 denotes a timing analysis unit-A, which performs timing analysis of the target path by accumulating the variation in delay of each gate in the path which is an analysis target (target path). Reference numeral 72 denotes a determination unit, to which the analysis result of the timing analysis unit-A 71 is supplied, and which determines whether the target path satisfies previously specified timing conditions (conditions relating to the setup time and hold time). The determination unit 72 outputs the determination result to a result output unit 38, and outputs the information relating to the path which does not satisfy the timing conditions to the coefficient arithmetically operating unit 33. A timing analysis unit-B 37 constitutes a second timing analysis unit of the present invention, and the timing analysis unit-A 71 constitutes a first timing analysis unit of the present invention.

Next, an operation of the timing analysis apparatus in the second embodiment will be explained.

Figure 8:
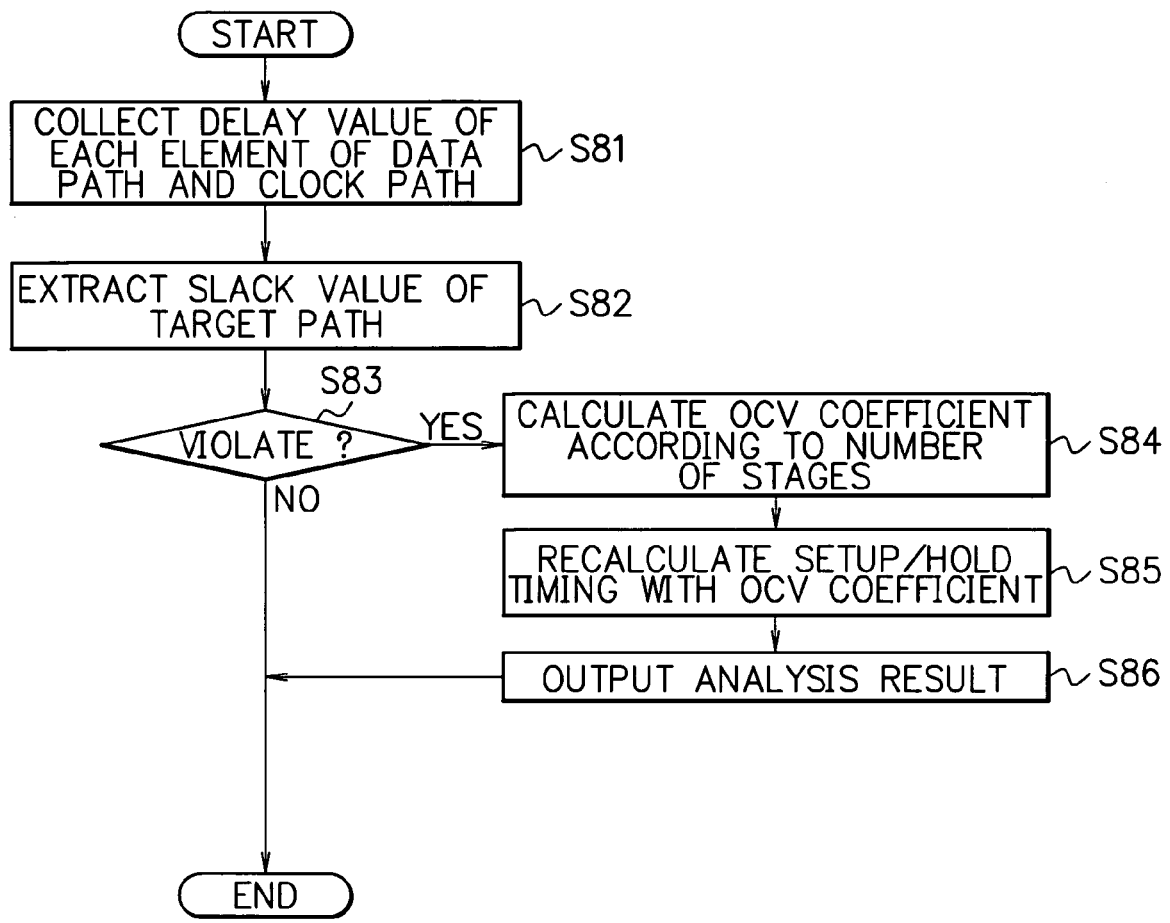
FIG. 8 is a flow chart showing an operation of the timing analysis apparatus in the second embodiment.

FIG. 8 is a flow chart showing the operation of the timing analysis apparatus shown in FIG. 7.

First, in step S81, the circuit information input unit 32 extracts a delay value (delay information) of each circuit element for each of the data path and the clock path of the target path from the inputted circuit information 31 as in step S41 shown in FIG. 4.

Next, in step S82, the timing analysis unit-A 71 performs timing analysis of the target path by accumulating the variation in delay of each gate in the target path with the same method as the prior art by using the circuit information including the delay values extracted in step S81. Then, it extracts a Slack value (value of the timing margin) of the target path.

Subsequently, in step S83, the determination unit 72 determines whether the timing conditions are violated (whether the previously specified timing conditions are satisfied or not) based on the Slack value obtained in step S82.

When it is determined that the timing conditions are not violated as a result of the determination in the above-described step S83, the determination unit 72 supplies the analysis result to the result output unit 38. On the other hand, when it is determined that the timing conditions are violated as a result of the determination in step S83, the determination unit 72 outputs the information relating to the target path (the information which enables the target path to be discriminated) to the coefficient arithmetically operating unit 33.

In step S84, when the coefficient arithmetically operating unit 33 receives the information relating to the target path violating the timing conditions, which is outputted from the determination unit 72, it executes the OCV coefficient calculation processing as in the first embodiment, and calculates the OCV coefficients according to the number of gate stages of the target path.

Next, the timing analysis unit-B 37 performs timing calculation relating to the setup time and the hold time in the target path by using the circuit information according to the target path and the calculated OCV coefficients (step S85), and supplies the calculation result to the result output unit 38 (step S86). The aforementioned processing is repeatedly executed for the other paths which are the analysis targets to finish the operation.

As explained thus far, according to the second embodiment, timing analysis of the target path is performed in the timing analysis unit-A 71 by accumulating the variation in the delay time of each gate by using the circuit information 31 as in the prior art, and as a result, only when it is determined that the timing conditions previously specified are not satisfied in the determination unit 72, timing analysis using the OCV coefficients with the number of gate stages being considered is performed as in the aforementioned first embodiment. As a result, the same effect as in the first embodiment can be obtained, and timing analysis with the variation degree in the entire path being reduced according to the number of gate stages can be carried out by extracting only the paths with the rigid timing constraints.

In the aforementioned second embodiment, two timing analysis units which are the timing analysis unit-A71 and the timing analysis unit-B37 are provided, but only one timing analysis unit may be provided and the circuit information, the OCV coefficient and the like to be inputted may be properly switched.

In the aforementioned first and second embodiments, the coefficient of the number of stages arithmetically operating section 34 in the coefficient arithmetically operating unit 33 calculates the coefficient of the number of stages each time based on the inputted circuit information 31, but the tables of the coefficient of the number of stages showing the corresponding relationship of the number of gate stages and the coefficient of the number of stages in the clock path and the data path as shown in FIG. 9A to FIG. 9C may be created, and the coefficients of the number of stages may be obtained with reference to these tables of the coefficient of the number of stages. FIG. 9A is a table of the coefficient of the number of stages of the clock path. FIG. 9B is a table of the coefficient of the number of stages of the data path under the worst condition, and FIG. 9C is a table of the coefficient of the number of stages of the data path under the best condition.

By using the tables of the coefficients of the number of the stages as shown in FIG. 9A to FIG. 9C, the coefficient of the number of stages arithmetically operating section 34 does not need to calculate the coefficient of the number of stages at each time based on the inputted circuit information 31, thus making it possible to reduce the amount of the arithmetic operation processing and shorten the time required for timing analysis.

In the aforementioned first and second embodiments, the wiring between the gates has a constant value without considering the distribution of delay, but the distribution of delay may be considered, and in this case, arithmetic operation may be performed similarly to the gate.

The timing analysis apparatuses in the aforementioned first and second embodiments can be constituted of a CPU or MPU of a computer, RAM, ROM, and the like, and can be realized by the operation of the program stored in the ROM, and the above-described program is included in the embodiments of the present invention. The timing analysis apparatus can be realized by recording the program for operating the computer to perform the above-described function in a recording medium such as, for example, a CD-ROM and making the computer read the program, and the recording medium in which the above-described program is recorded is included in the embodiments of the present invention. As the recording medium for recording the above-described program, a flexible disc, a hard disc, a magnetic tape, a magneto-optical disc, a nonvolatile memory card, and the like may be used other than a CD-ROM.

A program product by which the function of the above-described embodiments is realized by the computer executing the program and performing the processing is included in the embodiments of the present invention. As the above-described program product, there are the program itself which realizes the function of the above-described embodiments, a computer in which the above-described program is read, a transmission apparatus capable of providing the above-described program to the computers communicably connected via a network, a network system including the transmission apparatus, and the like.

Not only when the function of the above-described embodiments is realized by the computer executing the supplied program, but also when the function of the above-described embodiments is realized in cooperation of the program with an OS (operating system) operating in the computer, the other application software, or the like, and when all or part of the processing of the supplied program is performed by a function expanded board or a function expanded unit of the computer to realize the function of the above-described embodiment, such programs are included in the embodiments of the present invention. All or part of the program may be executed in the other computers to utilize the present invention in the network environment.

For example, the timing analysis apparatuses shown in the first and second embodiments each have a computer function 90 as shown in FIG. 10, and each of the operations in the above-described embodiments is carried out by a CPU 91 thereof.

The computer function 90 has a constitution in which the CPU 91, a ROM 92, a RAM 93, a keyboard controller (KBC) 95 of a key board (KB) 99, a CRT controller (CRTC) 96 of a CRT display (CRT) 100 as a display unit, a disc controller (DKC) 97 of a hard disc (HD) 101 and a flexible disc (FD) 102, and a network interface card (NIC) 98 are connected communicably with each other via a system bus 94.

The CPU 91 generally controls each component connected to the system bus 94 by executing a software (program) stored in the ROM 92 or HD 101, or a software (program) supplied from the FD 102.

Namely, the CPU 91 reads out the processing program for performing the operation as described above from the ROM 92, the HD 101, or the FD 102 and executes it, and thereby carries out the control to realize the operations in the above-described embodiments.

The RAM 93 functions as a main memory, a work area or the like of the CPU 91.

The KBC 95 controls input of the instruction from the KB 99, the pointing device not shown or the like. The CRTC 96 controls the display of the CRT 100. The DKC 97 controls the access with the HD 101 and the FD 102 which stores a boot program, various kinds of applications, user files, a network management program, the above-described processing program and the like in the above-described embodiments. The NIC 98 exchanges date with the other devices on the network 103 bidirectionally.

As described above, calculating a variation coefficient of the delay time in an entire path to be analyzed in accordance with a number of gate stages in the path, and performing a timing analysis with use of the variation coefficient, thereby accurate timing analysis in consideration of the variation in a chip according to the number of gate stages can be carried out. As a result, timing analysis according to proper timing margin becomes possible, for example, design of a semiconductor integrated circuit demanded of a high-speed operation can be made more easily than the prior art.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A timing analysis apparatus for performing timing analysis of a semiconductor integrated circuit based on inputted circuit information, comprising:
    a first timing analysis unit performing timing analysis in a target path which is an analysis target in the semiconductor integrated circuit by accumulating a variation in delay time of each gate in the target path, based on circuit information;
    a determination unit determining whether previously specified timing conditions are satisfied or not based on a result of the timing analysis supplied from said first timing analysis unit;
    a coefficient arithmetically operating unit calculating variation coefficients of delay time in the target path with the variation in the delay time of each gate being cancelled out in accordance with a number of gate stages in the target path only when it is determined that the timing conditions are not satisfied in said determination unit; and
    a second timing analysis unit performing timing analysis in the target path based on the circuit information and the variation coefficients calculated by said coefficient arithmetically operating unit.

2. The timing analysis apparatus according to claim 1, wherein said coefficient arithmetically operating unit further comprises:
    a coefficient of the number of stages arithmetically operating section calculating coefficients of the number of stages indicating variation amounts in delay time according to the number of gate stages in the target path based on the circuit information;
    a variation width arithmetically operating section calculating a variation width of delay time in the entire target path based on the circuit information; and
    a variation coefficient arithmetically operating section calculating the variation coefficients of the delay time in the target path based on the calculated coefficients of the number of stages and the variation width of the delay time.

3. The timing analysis apparatus according to claim 2, further comprising:
    a table of coefficients of the number of stages in which an optional number of gate stages in a path and the coefficients of the number of stages are made to correspond to each other,
    wherein said coefficient of the number of stages arithmetically operating unit obtains the coefficients of the number of stages according to the number of gate stages in the target path with reference to said table of the coefficients of the number of stages.

4. The timing analysis apparatus according to claim 1, further comprising:
    an information input unit inputting the circuit information therein and extracting delay information relating to delay time of each gate in the target path from the circuit information, wherein said coefficient arithmetically operating unit calculates the variation coefficients of the delay time in the target path based on the extracted delay information of each gate.

5. The timing analysis apparatus according to claim 1, wherein:
    said first timing analysis unit verifies whether previously specified timing conditions are satisfied in the target path or not, based on the calculated variation coefficients and the circuit information.

6. The timing analysis apparatus according to claim 5, wherein:
    the timing conditions are the conditions relating to setup time and hold time in the target path.

7. The timing analysis apparatus according to claim 1, further comprising:
    an information input unit inputting the circuit information therein and extracting delay information relating to the delay time of each gate in the target path,
    wherein said second timing analysis unit performs timing analysis of the target path based on the extracted delay information of each gate.

8. A timing analysis method for performing timing analysis of a semiconductor integrated circuit based on inputted circuit information, comprising:
    a delay information extracting step of extracting, from the inputted circuit information, delay information relating to delay time of each gate in a target path constituting an analysis target in the semiconductor integrated circuit from the circuit information;
    a first timing analysis step of performing timing analysis in the target path by accumulating the variation in the delay time of each gate in the target path based on the delay information extracted in said delay information extracting step;
    a determination step of determining whether previously specified timing conditions are satisfied or not, based on an analysis result in said first timing analysis step;
    a coefficient arithmetically operating step of calculating variation coefficients of the delay time of each gate in the target path with a variation in the delay time of each gate being cancelled out in accordance with the number of gate stages in the target path, based on the delay information extracted in said delay information extracting step, said coefficient arithmetically operating step is executed only when it is determined that the timing conditions are not satisfied in said determination step; and a second timing analysis step of performing timing analysis in the target path based on the circuit information and the calculated variation coefficients calculated in said coefficient arithmetically operating step.

9. The timing analysis method according to claim 8, wherein:

said coefficient arithmetically operating step comprises a coefficient of a number of stages of arithmetically operating steps of calculating coefficients of a number of stages showing variation amounts of delay times according to the number of gates in the target path, based on the circuit information;

a variation width arithmetically operating step of calculating a variation width of delay time of the entire target path, based on the circuit information; and a variation coefficient arithmetically operating step of calculating the variation coefficients of the delay time in the target path, based on the coefficients of the number of stages calculated in said coefficient of the number of stages arithmetically operating step and the variation width of the delay time calculated in said variation width arithmetically operating step.

10. A computer-readable recording medium recording a program for controlling a computer to execute:

a delay information extracting step of extracting delay information relating to delay time of each gate in a target path constituting an analysis target in a semiconductor integrated circuit from circuit information of the semiconductor integrated circuit;

a first timing analysis step of performing timing analysis in the target path by accumulating a variation in the delay time of each gate in the target path, based on the delay information extracted in said delay information extracting step;

a determination step of determining whether previously specified timing conditions are satisfied or not, based on an analysis result in said first timing analysis step;

a coefficient arithmetically operating step of calculating variation coefficients of delay time in the target path with the variation in the delay time of the each gate being cancelled out in accordance with a number of gate stages in the target path, based on the delay information extracted in said delay information extracting step, only when it is determined that the timing conditions are not satisfied in said determination step, said program product makes the computer execute said coefficient arithmetically operating step; and a second timing analysis step of performing timing analysis in the target path based on the circuit information and the calculated variation coefficients calculated in said coefficient arithmetically operating step.

11. The computer-readable recording medium according to claim 10, wherein:

said coefficient arithmetically operating step comprises a coefficient of a number of stages of arithmetically operating steps of calculating coefficients of a number of stages indicating variation amounts of delay time according to the number of gate stages in the target path, based on the circuit information;

a variation width arithmetically operating step of calculating a variation width of delay times in the entire target path, based on the circuit information; and a variation coefficient arithmetically operating step of calculating the variation coefficients of the delay time in the target path, based on the coefficients of the number of stages calculated in said coefficient of the number of stages arithmetically operating step and the variation width of the delay time calculated in said variation width arithmetically operating step.

12. The computer-readable recording medium according to claim 11, wherein:

the coefficients of the number of stages according to the number of gate stages in the target path is obtained with reference to a table of the coefficient of the number of stages with an optional number of gate stages in a path and the coefficient of the number of stages being made to correspond to each other, recorded in the recording medium.

13. A timing analysis apparatus performing timing analysis of a semiconductor integrated circuit based on inputted circuit information, comprising:

a controller:

performing timing analysis in a target path in the semiconductor integrated circuit by accumulating a variation in delay time of each gate in the target path, determining whether previously specified timing conditions are satisfied based on a result of the performed timing analysis, performing timing analysis in the target path based on calculated variation coefficients of delay time in the target path with the variation in the delay time of each gate being cancelled out in accordance with a number of gate stages in the target path, only when said timing conditions are not satisfied.

* * * * *

UNITED STATES PATENT AND TRADEMARK OFFICE
CERTIFICATE OF CORRECTION

PATENT NO.        : 7,219,320 B2                                          Page 1 of 1
APPLICATION NO.   : 10/807286
DATED             : May 15, 2007
INVENTOR(S)       : Tetsuo Kawano et al.

It is certified that error appears in the above-identified patent and that said Letters Patent is hereby corrected as shown below:

First Page, Column 1 (Title), Line 2, change "APPARATUS" to --APPARATUS,--.

Column 1 (Title), Line 2, change "APPARATUS" to --APPARATUS,--.

Signed and Sealed this

Fourth Day of September, 2007

JON W. DUDAS
*Director of the United States Patent and Trademark Office*